(12) United States Patent
Kase

(10) Patent No.: US 6,198,314 B1
(45) Date of Patent: Mar. 6, 2001

(54) SAMPLE AND HOLD CIRCUIT AND METHOD THEREFOR

(75) Inventor: Kiyoshi Kase, Pflugerville, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/236,064

(22) Filed: Jan. 25, 1999

(51) Int. Cl.$^7$ .............................. G11C 27/02; H03K 7/02
(52) U.S. Cl. ............................. 327/94; 327/91; 327/259
(58) Field of Search ........................... 327/94, 96, 536, 327/91, 259

(56) References Cited

U.S. PATENT DOCUMENTS 5,448,189 * 9/1995 Lacroix et al. ....................... 327/91

FOREIGN PATENT DOCUMENTS

356007298 * 5/1990 (JP) ......................... 327/94
402137200 * 5/1990 (JP) ......................... 327/94

OTHER PUBLICATIONS

Munroe, etc., "2–$\mu$m, 1.6 mW Gated–gm Sampler with 72–dB SFDR for fs=160 Ms/s and fin=320.25 MHz" IEEE Journal of Solid State Circuits, vol. 33, No. 3, pp. 400–403, Mar. 1998.

* cited by examiner

*Primary Examiner*—Dinh T. Le

(57) ABSTRACT

A sample and hold circuit (200) accepts an input (202). During a first half of the clock (204) (either an active high portion or an active low portion) the devices (216, 220, and 222) drive the node (218) to a voltage representative of the voltage present on input (202). At a rising edge of the clock (204), the switch (222) is disabled and the voltage on the node (218) is forced to a higher hold voltage by a capacitor (224). While sample circuit (208) is holding the high voltage on node (218), a hold circuit (210) is settling to a hold voltage representative of the voltage on node (218) in a master-slave fashion. This manner of clocking and controlling the circuit (200) allows circuit (200) to be used in low power, high speed telecommunications systems.

11 Claims, 3 Drawing Sheets

SAMPLE AND HOLD CIRCUIT AND METHOD THEREFOR

FIELD OF THE INVENTION

The present invention relates generally to electronic circuitry, and more particularly to a sample and hold circuit.

BACKGROUND OF THE INVENTION

The telecommunications industry has created an infrastructure that can transfer information to one location to another location using many different kinds of technology and many different protocols. For example, information may be electronically communicated today using one or more of asymmetric digital subscriber line (ADSL) devices, cable modems, asynchronous transfer mode (ATM) hosts, V.90 modems, and a wide array of other protocols and devices. In order to enable effective communication of analog and/or digital information from one point to another using these resources, sample and hold circuits are routinely used within larger telecommunications systems. Therefore, sample and hold circuits are an integral and important component in telecommunication operations.

FIG. 1 illustrates a prior art circuit which may be used to sample and hold an analog input for use in telecommunications. Circuit 10 of FIG. 1 has an analog in put 12, a clock (CLK) input signal 11, and a sample output 14. The analog input 12 is a gated input and is not a continuously provided electrical signal. The input 12 is disconnected from transistor 20 during one half cycle of the clock 11 (either the logic high portion or the logic low portion of the clock's duty cycle). The circuit 10 is powered by a supply voltage ($V_{cc}$) 16 and a ground voltage (GND) 18.

In FIG. 1, the selectively gated analog input signal 12 is provided to a control electrode of an input bipolar transistor 20.

The transistor 20 is serially coupled to a current source 22 through a node 21. The current source 22 is coupled between the transistor 20 and the ground (GND) 18 as shown. The node 21 is also coupled to a control electrode of a transistor 26 and a first electrode of a capacitor 24. The first current electrode of transistor 26 is coupled to the power supply voltage ($V_{cc}$) 16, and a second current electrode of transistor 26 provides the output signal 14. A second electrode of the capacitor 24 is coupled to the ground (GND) line 18 as shown. The second current electrode of transistor 26 is also coupled through a current source 28 to the ground terminal 18.

In operation, the node 21 is charged by transistor 20, the current source 22, and the capacitor 24 to a voltage value that is representative of the input 12. Once this voltage is stable due to the settling of RC delays, skew, etc., the clock 11 switches the current source 22 off and disables the input to transistor 20. After the disabling the clock 11 and the input 12, this sampled signal on node 21 is substantially preserved over short time periods by the capacitor 24. During this storage time, the voltage on node 21 is provided to the transistor 26 and the current source 28 to provide an output 14. It is this output 14 that is held by a hold circuit for later processing.

The sample circuit illustrated in FIG. 1, which is used to perform a sample and hold function, is problematic for several reasons. First, if the input 12 is not gated, when the current source 22 in the circuit of FIG. 1 is switched off by the clock signal 11, then the input voltage 12 could rise above the sum of (1) the voltage on node 21 and (2) threshold voltage (Vt) drop. If the input voltage rises above this sum, then transistor 20 will be placed into a conducting state, thereby destroying the stored voltage on node 21. For this reason, the input voltage 12 is gated or grounded when the current source 22 is disabled. Unfortunately, the switching of the input signal 12 is disadvantageous since it may introduce noise into the signal 12. In addition, it takes time to turn the input 12 on and off and some time to wait for the input to stabilize before useful information is obtained in the circuit 10. Therefore, the presence of the gated input 12 will slow device operation and result in degradation in performance. Also, the timing of the switching on and off of the current source 22 and the timing of the gating of the input 12 is critical and not easily set to an optimal point. Further, the switch circuitry added to the input line 12 adds additional circuitry to the circuit size.

In addition to the disadvantages associated with switching off the input voltage 12 during certain periods of time, the circuit 10 places two base-emitter diode paths between the input 12 and the output 14. Even if the transistors 20 and 26 could be replaced with metal oxide semiconductor field effect transistors (MOSFETs), there would still be two threshold voltage drops between the input 12 and the output 14. Such voltage drops are usually on the order of 0.5 volts to 1.2 volts each. Therefore, these threshold voltage drops or base emitter junctions would erode at least 1.0 volt from the rail-to-rail range of the output 14. For low power supply voltages, this erosion could be 50% or more of the rail-to-rail range available between $V_{cc}$ 16 and GND 18. The result of this limitation is that noise margins are reduced or that $V_{cc}$ 16 must be set to a sufficiently high level, or both. When $V_{cc}$ is raised, power consumption of the circuit 10 is increased. Therefore, the circuit of FIG. 1 does not offer a low power sample and hold solution for low power applications.

In addition, the natural capacitance of the base-emitter junction of transistor 20 has an adverse affect on the speed of operation of circuit 10. Therefore, the operation of circuit of FIG. 1 is further degraded. Certain high communication rates cannot be supported by the circuit 10.

In order to overcome the deficiencies of FIG. 1, the prior art has added significant numbers of components to circuit 10. These components slightly mitigate the described deficiencies at the expense of huge increases in circuit size and, thus, cost. Another solution to the problems discussed above is to abandon the simple bipolar circuit of FIG. 1 and adopt a much more radical circuit design (e.g., use a complex interconnection of charge coupled devices or other more advanced devices) using more complex and expensive processing. Such progression to more complex devices and manufacturing processes means that it is much more difficult to manufacture a high yield product in a low cost environment. In addition, the more exotic a device is, the more difficult it is to integrate that device into other technologies.

Therefore, a need exists in the industry for a sample and hold circuit that reduces the disadvantages discussed above and does so preferably with reduced cost and improved ability to integrate the circuit with other active components.

DETAILED DESCRIPTION OF A PREFERRED EMBODIMENT

Figure 1:
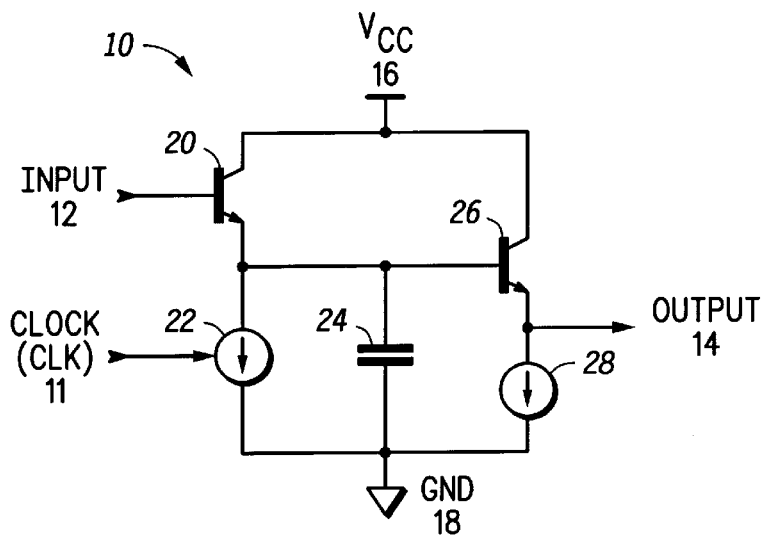
FIG. 1 illustrates, in a circuit schematic diagram, a prior art sample circuit.
Figure 2:
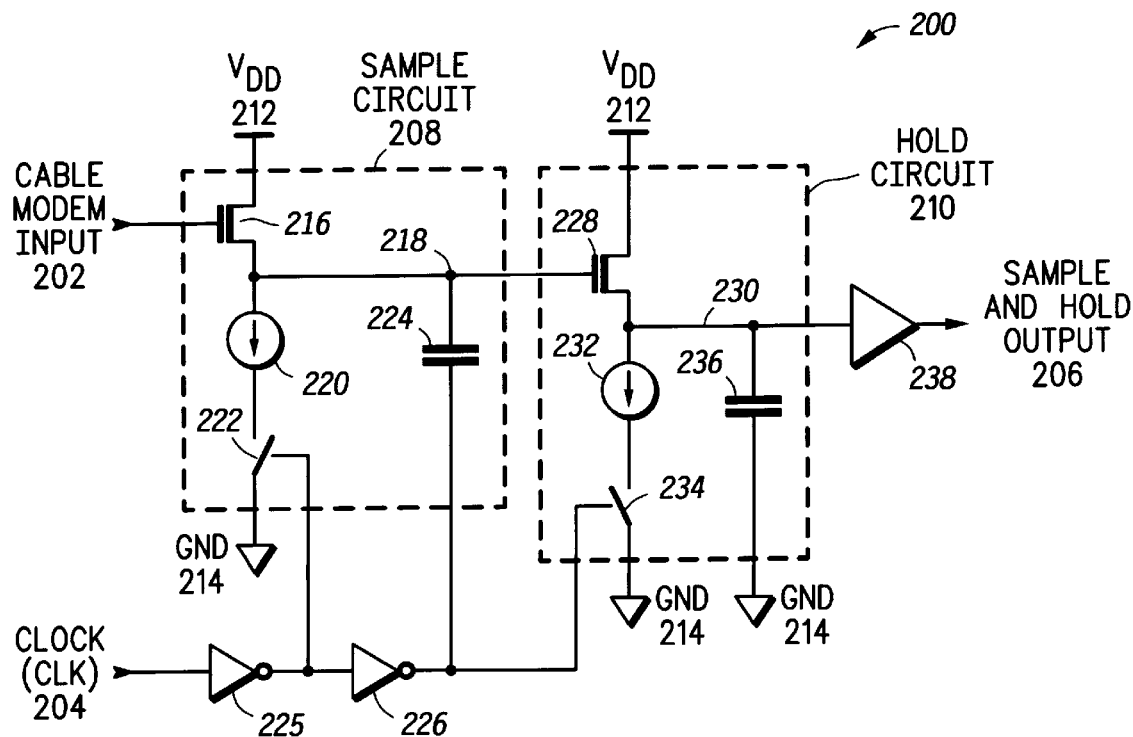
FIG. 2 illustrates, in a circuit schematic diagram, a sample and hold circuit in accordance with the present invention.
Figure 3:
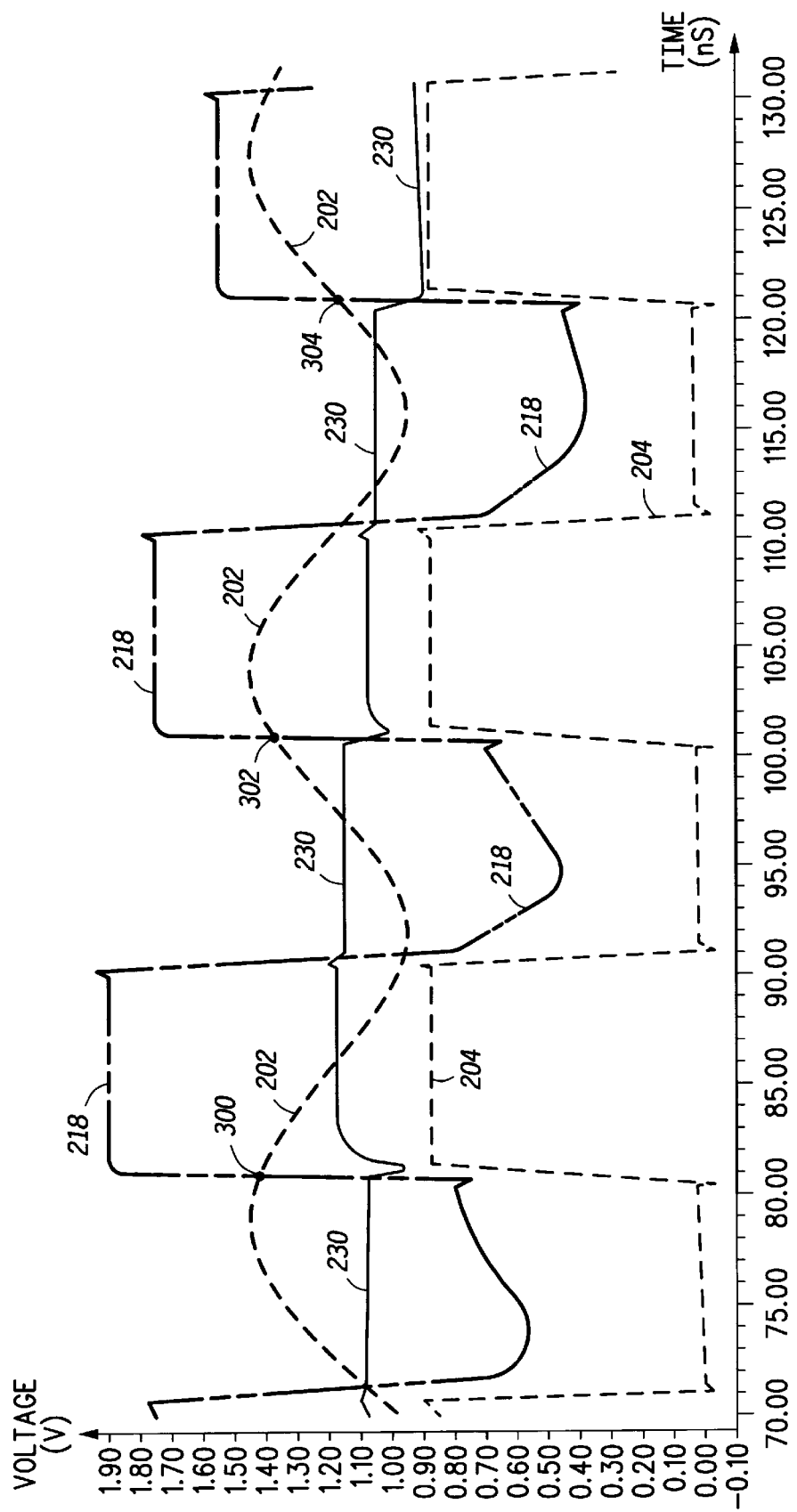
FIG. 3 illustrates, in a timing diagram, the voltages present on various nodes of FIG. 2 in operation.
Figure 4:
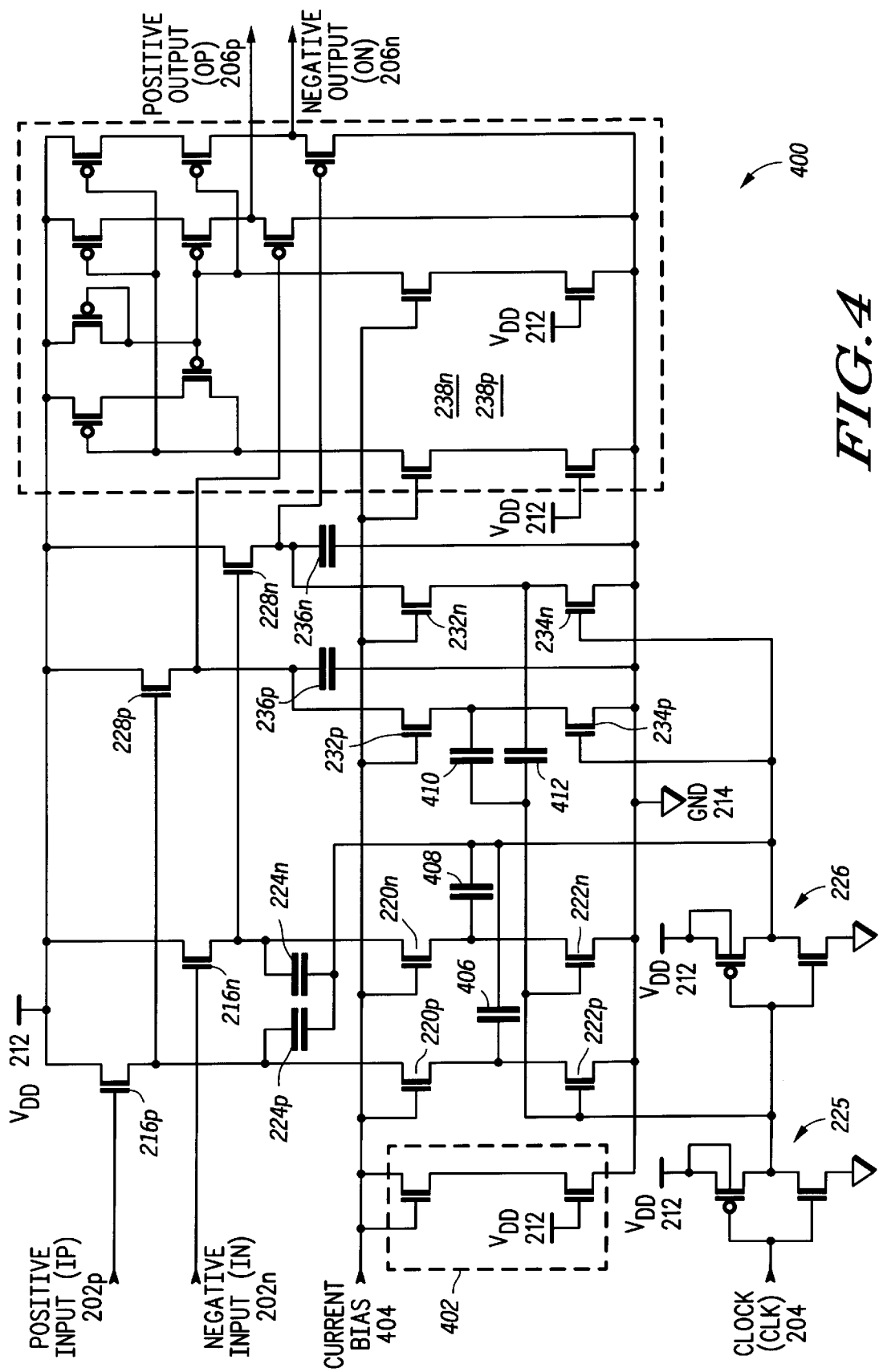
FIG. 4 illustrates, in a circuit schematic diagram, the circuitry of FIG. 2 in greater detail and in accordance with the present invention.

Generally, FIGS. 2–4 herein illustrate a sample and hold circuit 200 and method of operation that is improved over that illustrated in FIG. 1. Instead of coupling a bottom terminal of the capacitor 24 to ground as shown in FIG. 1, a sample capacitor 224 is coupled to a clock signal that oscillates between a high voltage and low voltage during different time periods. The dynamic coupling of the capacitor 224 to both a logic high signal and to a low signal in different clock time periods allows the circuit of FIG. 2 to accept a continuous stream of analog input 202. Note, circuit 10 required a gated input 12 to the transistor 20. By ensuring that the input 202 need not be gated in FIG. 2, circuit 200 is improved over the circuit of FIG. 1 by reducing input noise, by reducing timing complexity, by reducing related component count, and by increasing the speed of operation of the sample and hold circuit.

In addition, the cyclical clocking of the bottom electrode of the capacitor 224 allows the voltage of the sample node 218 to be pushed to a higher voltage during certain half-cycles of the clock. This voltage increase compensates for any threshold voltage or emitter base junction losses occurring within the transistors 216 and 228. By reducing or eliminating the voltage loss experienced in FIG. 1, dynamic range is increased and/or a lower power supply voltage $V_{DD}$ may be used. These advantages make sample and hold circuit 200 more likely to be effective in low power applications.

Further, the voltage increase on node 218 described above compensate for the base-emitter parasitics of transistor 216 thereby reducing their adverse effects upon speed and frequency. Therefore, the circuitry of FIG. 2 can operate at a faster rate than circuit 10 illustrated in FIG. 1. Again, the circuit of FIG. 2 is more likely to be used in high data rate communication systems than is the circuit of FIG. 1.

The improved sample and hold method and circuit taught herein may be used with analog-to-digital (A/D) converters and/or within telecommunication systems (e.g., cable modems) and can be further understood with specific reference to FIGS. 2–4.

FIG. 2 illustrates an improved sample and hold circuit 200 over that illustrated in FIG. 1. The circuit 200 of FIG. 2 illustrates two primary circuit modules or circuit portions. The first primary circuit module in FIG. 2 is a sample circuit 208, and the second primary circuit module is a hold circuit 210. These circuits portions are generally provided with a power supply voltage ($V_{DD}$) 212 to power various electrical devices. Preferably, $V_{DD}$ 212 is less than or equal to 3.3 volts to minimize power consumption, but $V_{DD}$ may be any power supply voltage that functionally powers electrical components. In addition, the circuit 200 is coupled to one or more ground lines, ground terminals, or ground planes (GND) 214 as shown in FIG. 2.

The circuitry 200 of FIG. 2 is controlled via a non-inverted clock signal and/or an inverted clock signal, both of which are derived from a clock (CLK) input 204 shown in FIG. 2. The inverted or non-inverted forms of the clock are provided via one or more inverters 225 and 226 shown in FIG. 2. FIG. 2 also illustrates that sample circuit 208 receives an input 202 which is preferably illustrated in FIG. 2 as being an analog cable modem signal. It is important to note that the signal 202 may be any electrical signal for any application where such signal requires sample and hold processing. The circuit 200 provides as an output a sample and hold signal 206 which is derived from the input 202 under control of the clock (CLK) signal 204.

Generally, an inverted clock signal and a non-inverted clock signal derived from clock signal 204 and the input signal 202 are provided to the sample circuit 208 in FIG. 2. The sample circuit 208 contains an input transistor 216 which receives the input 202 via a gate terminal or control electrode. Transistor 216 is specifically illustrated in FIG. 2 as being an N channel metal oxide MOSFET. However, transistor 216 may be any transistor or combination of electrical components including one or more bipolar transistors, junction field effect transistors (JFETs), P channel devices, optocouplers, and/or other devices. The general purpose of device 216 is to provide a mechanism by which a voltage on the input 202 can create a voltage on node 218 representative of the input voltage. In FIG. 2, transistor 216 operates in a source follower mode when conducting. In a source follower mode, the voltage generated on node 218 is representative of the input voltage 202.

The drain or current electrode of transistor 216 (or sample node 218), is connected to a current source 220 within sample circuit 208. The current source 220 has a second terminal that is connected to a switch 222. Generally the switch is a transmission complimentary metal oxide semiconductor (CMOS) gate or a single pass transistor. However, switch 222 can be any electrically programmable switching device. The switch 222 in sample circuit 208 is coupled between the current source 220 and the ground terminal 214. A gate of switch 222 is coupled to the clock signal provided by inverter 225. In addition, the node 218 within the sample circuit 208 is connected through a sample capacitor 224 to an inverted clock signal provided by inverter 226. Generally, capacitor 224 is an N channel MOSFET coupled as a two-terminal capacitor. However, capacitor 224 may be any capacitor such as a poly-to-poly capacitor, a field oxide capacitor, a junction capacitor, or a like charge storage device.

FIG. 2 shows that both an inverted and non-inverted clock signals are generated from clock (CLK) 204 by inverters 225 and 226. It is important to note that one inverter may be deleted from FIG. 2 and still result in the formation of all the needed clock signals. In addition, clock signals are sometimes buffered by many inverters. It is preferred that the signal provided to the capacitor 224 from the clock terminal 204 is inverted from or 180 degrees out-of-phase with the signal provided from the clock terminal 204 to the transistor 222. The sampled voltage present on node 218 which is representative of the input voltage 202 is provided as an output of the sample circuit 208.

The output 218 of the sample circuit 208 is provided as an input to the hold circuit 210. Therefore, the node 218 is coupled to a transistor 228 illustrated in FIG. 2. While transistor 228 is illustrated in FIG. 2 as being an N channel MOSFET, the device 228 may be a bipolar transistor or another type of one or more active electronic devices as discussed above for transistor 216. A source electrode of transistor 228 is coupled to the power supply voltage $V_{DD}$ 212, and a drain electrode of the transistor 228 is coupled to a node 230. The node 230 is coupled to a first terminal of a current source 232 within hold circuit 210. A second terminal of the current source 232 is coupled to a switch 234, illustrated within the hold circuit 210. The switch 234 has a control electrode or a gate electrode which is powered by the inverter 226 so that the switch 234 may be electrically opened or closed. Generally, the control gate of the device 234 is to be a clock signal of the substantially same polarity as the clock signal provided to the capacitor 224. Conversely, the clock signals provided to switches 222 and 234 are of opposite polarity types. Generally, these two clock signals provide asymmetric and/or non-overlapping operation of currents sources 220 and 232. The node 230 is also coupled through a hold capacitor 236 to the ground (GND) plane 214. The node 230 operates to hold a voltage for an input to an amplifier 238. The voltage 230 is representative of a value of the input voltage 202 at a specific sample point in time. The specific sample point in time is defined by the rising edge of the clock 204 in a preferred embodiment. The amplifier 238 will amplify the signal present on the node 230 to provide a sample and hold output 206 as illustrated in FIG. 2.

The operation of the sample circuit 208 and the hold circuit 210 in conjunction with the other circuitry shown in FIG. 2 can be best understood with reference to FIG. 3. FIG. 3 illustrates a timing diagram. The x-axis of FIG. 3 is in the units of nanoseconds (ns) and shows the operation of the circuit of FIG. 2 for a 60 ns period using a 50 MHz clock signal 204. The y-axis represents voltage values (V) and ranges from 0.0 volts to 1.90 volts. FIG. 3 therefore shows the voltages present on various nodes, inputs, and outputs of FIG. 2 over a short range of time. While specific voltages, times, frequencies, and polarities are shown in FIG. 3, it should be apparent to one of ordinary skill in the art that other embodiments may be easily formulated from the teachings of FIGS. 2–3.

Continuing, FIG. 3 illustrates a sinusoidal analog input voltage 202 with a high peak at roughly 1.5 volts and a low peak at roughly 1.0 volts. This input voltage 202 is applied to the input terminal 202 illustrated in FIG. 2. FIG. 3 also illustrates the 50 MHz clock signal 204 which is applied to the clock terminal 204 of FIG. 2. In addition to showing the input signal 202 and the clock signal 204, FIG. 3 illustrates the effect that these two input signals have on the sample node 218 and the hold node 230 over time.

Operation of Sample Circuit 208

Tracking Phase

In the far left-hand side of FIG. 3, a falling edge of the clock 204 will turn on the switch 222 of FIG. 2 whereby the current source 220 will begin to pull current through the transistor 216. Current will be provided through the transistor 216 via the current source 220 for as long as the clock signal is in a low logic state (roughly for the time period from 71 ns to 81 ns in FIG. 3). In addition, this same falling edge of the clock near the 71 ns time point in FIG. 3 will drive a bottom terminal of the capacitor 224 to ground. Since the voltage across the capacitor 224 (voltage on node 218 minus the voltage output from the inverter 226) cannot instantaneously change in time, the instantaneous drop of the bottom terminal of capacitor 224 to ground (GND) will cause a voltage on node 218 to follow this drop by an identical or a nearly identical amount. Therefore, the falling edge of the clock 204 in FIG. 3 from roughly 0.85 V to 0 V results in a 0.85 V drop in the node 218 as illustrated in a far left-hand portion of FIG. 3. The falling edge of the clock returns the voltage on node 218 to a voltage less than that present on the input 202 and activates the current source path in circuit 208.

This activation of the current source path and the lowering of the voltage on node 218 in response to a falling edge of the clock indicates the beginning of a tracking phase for the circuit 200. The tracking mode lasts as long as the clock remains at a logic low level (e.g., in this case it lasts for 10 ns from the 71 ns point to the 81 ns point of FIG. 3). During this tracking period, when the clock 204 is at a logic low value, the switch 222 is closed and the current source 220 is operating. During tracking, the RC time constant of the sample circuit 208 settles whereby the transistor 216 eventually begins to operate in a source follower mode. In a source follower mode, the voltage on node 218 is a direct function of the voltage of input 202 minus some losses through transistor 216 (e.g., threshold voltage loss). In addition, the gain factor may be less than 1:1 in some cases. In any event, when in the tracking mode, transistor 216 drives the voltage on sample node 218 to a voltage representative of the input 202.

The 10 ns tracking mode is illustrated in FIG. 3. After a time period for RC time constant settling, the voltage on node 218 is driven to and follows a voltage present on the input 202. Specifically, between the time periods of approximately 75 ns and 80 ns in FIG. 3, a voltage on node 218 can be clearly seen to follow the general progression of the voltage present on the node 202.

Dormant Phase

After time is given to allow tracking to be accurate, a rising edge of the clock signal occurs at approximately the 81 ns mark in FIG. 3. A rising clock edge indicates the end of the tracking period for the sample circuit 208 and the beginning of the dormant period for circuit 208. On the rising edge of the clock in FIG. 3, the voltage level present on node 218 is captured and held on the capacitor 224. This capture occurs when the clock edge turns off switch 222. When switch 222 is turned off, current source 220 can no longer affect the voltage state of node 218. Simultaneously to the shutting off of the circuit 222, the rising edge of the clock voltage causes a nearly instantaneous 0.9 volt increase in the voltage on the bottom node of capacitor 224. Since the differential voltage across the plates of a capacitor cannot change instantaneously, the top electrode of capacitor 224 (which is node 218) in FIG. 2 must rise by roughly 0.9 volts (slightly less may result due to leakage or other losses). This 0.9 v incremental change on node 218 is illustrated in the signal 218 at roughly the 81 ns X axis mark of FIG. 3.

In summary, capacitor 224 has now captured a voltage representative of the analog voltage present at the input 202 at the point 300 in FIG. 3. In addition to preserving that representative voltage, the signal 218 has now been forced to a fixed higher voltage magnitude determined by the magnitude of the voltage of the clock. Further, for the entire duration of the high level of the clock (approximately 81 ns to 91 ns), the voltage 218 remains fixed at the 1.9V high voltage. Again, this voltage is representative of a voltage 300 of the analog signal 202 at roughly 81 ns.

From 81 ns to 91 ns, the voltage on node 218 is greater than a voltage present on the input 202. Due to this voltage difference, the gate-to-source voltage of the transistor 216 places the transistor into a non-conducting state. Therefore, there is no need for any circuitry to switch on and off the input signal 202. Upon the falling edge of the clock (approximately the 91 ns mark of FIG. 3), the sample circuit 208 once again enters the tracking mode whereby the bottom electrode of capacitor is returned to ground, resulting in a near instantaneous 0.9 V drop in the voltage on node 218. Therefore, in the time period of approximately 90 ns to 100 ns in FIG. 3, the 10 ns duration tracking period discussed above begins again.

In summary, FIG. 3 illustrates that the sample circuit 208 is placed into a tracking mode by the falling edge of the clock and is placed high voltage dormant hold mode by a rising edge of the clock.

Operation of Hold Circuit 210

Holding Phase

Where a falling edge of the clock closes the circuit 222 and enables the sample circuit 208 in a tracking mode, the falling edge of the clock opens the switch 234 and places the hold circuit 210 in a voltage holding mode. Therefore, while sample circuit 208 is tracking the input 202 in the time period of 72 ns to 80 ns, the circuit 210 is in a holding mode. In other words, while node 218 is adjusting itself to track the input 202, the hold circuit 210 is holding a previously sampled voltage from sample circuit 208.

Settling Phase

Upon the occurrence of the rising clock edge and during the time period in which the clock is at a high voltage state (e.g., time period 81 ns to 91 ns in FIG. 3), the switch 234 is closed and the current source 232 begins to conduct current through the transistor 228. From 81 ns to 91 ns in FIG. 3, node 230 is settling to a voltage that is representative of the voltage present on node 218. During high logic level cycles of the clock 204 in FIG. 3, hold circuit 210 settles toward a hold voltage representative of the input 202 in a settling stage. Therefore, when sample circuit 208 is tracking, hold circuit 210 is holding a voltage (i.e., in a hold mode). Conversely, when circuit 208 is in high voltage dormant mode, circuit 210 is in a settling mode in order to store a voltage proportional to the intermediate voltage on node 218.

When the falling edge of the clock 204 occurs and the clock returns to a logic low value (e.g., at time 91 ns of FIG. 3), the switch 234 in the hold circuit 210 is switched off. The voltage on node 230 is held constant for use by the amplifier 238 (i.e., circuit 210 is in a hold mode once again). During low logic level periods of the clock, the voltage on node 230 is held to a stable value representative of the input 202 by capacitor 224. Note, during the time period of 91 ns to roughly 101 ns in FIG. 3 and all other time periods in which the clock is at a logic low value, the voltage on node 218 is always less than a voltage held on node 230. Due to this relationship, transistor 228 is turned off automatically due to a reverse biased gate-to-source voltage, Vgs. Therefore, the falling edge of the clock signal prevents transistor 228 from affecting the operation of circuit 210 and vice versa.

Since capacitor 224 is controlled by an inverted clock signal, transistors 216 and 228 can be automatically turned on and off by clock edges. Again, no gated input signal is needed as in the prior art FIG. 1. This ability to provide an unbroken stream of input voltage to the circuit of FIG. 2 is an advantage over the circuit illustrated in FIG. 1. In addition, by causing the voltage on the node 218 to be elevated by a rising edge of the clock as shown in FIG. 3, threshold voltage drops and/or base-emitter voltage drops occurring across transistors 216 and 228 can be compensated for by the circuit of FIG. 2. The circuit of FIG. 2 can operate at a much lower $V_{DD}$ operational voltage than the circuit of FIG. 1. Therefore, FIG. 2 is a lower power solution and will have improved noise margins that the solution of FIG. 1. In addition, the circuit of FIG. 2 removes adverse input-to-output affects of junction capacitance and/or base emitter capacitance of transistor 216 and prevents such parasitics from adversely affecting the speed and operational frequency of FIG. 2. Therefore, the circuit of FIG. 2 can be run at a greater speed with higher throughput than the circuit in FIG. 1. Such greater speed is essential for use in many high speed telecommunications systems.

Circuit 200 of FIG. 2 is a single input and a signal output circuit. FIG. 4 illustrates how the methodology and general circuitry discussed in FIG. 2 can be specifically applied to form a differential input/differential output circuit very similar in function to that illustrated in FIG. 2. Note, single input/differential output and differential input/single output circuits are also possible given the teachings of FIGS. 2–4 herein. Since FIG. 4 is a differential circuit, FIG. 4 is basically two instantiations of circuit 200. One instantiation of circuit 200 handles a positive input/output portion in FIG. 4. Another instantiation of circuit 200 handles the negative input/output portion of FIG. 4. FIG. 4 generally illustrates two side-by-side circuits whereby the referenced numerals from FIG. 2 are duplicated in FIG. 4 for ease of understanding. In FIG. 4, a reference numeral #n refers to a component used in the negative differential portion, and a reference numeral #p in FIG. 4 refers to a component that is used in the positive differential portion. A description of one portion of FIG. 4 (either negative or positive) will be the same as a description for the other portion of FIG. 4 (either negative or positive). Therefore, the positive circuit portion is described in detail herein with the negative portion being discussed in much less detail.

FIG. 4 shows a positive input terminal/signal (IP) 202p which is analogous to the input 202 shown in FIG. 2. FIG. 4 contains a transistor 216p which is analogous to the transistor 216 of FIG. 2. FIG. 4 illustrates that a current bias voltage 404 is provided to a bias circuit 402. The bias circuit 402 is connected to a transistor 220p which functions as the current source 220 in FIG. 4. In addition, FIG. 4 illustrates a transistor 222p which is analogous to the switch 222. The positive differential portion of circuit 400 has a sample capacitor 224p which is analogous to the sample capacitor 224.

The clock (CLK) signal 204, which is fed through inverters 225 and 226 in FIG. 2, is also illustrated via inverters and clock input signal(s) in the bottom portion of FIG. 4. The transistor 228p of FIG. 4 is analogous to the transistor 228. The transistor 232p of FIG. 4 operates as the current source 232 of FIG. 2. Similarly, transistor 234p of FIG. 4 functions as switch 234 of FIG. 4. FIG. 4 illustrates capacitor 236p which is analogous to capacitor 236 in FIG. 2. On a right-hand side of FIG. 4, a plurality of transistors are interconnected to form an amplifier 238p which is used to provide the positive output (OP) 206p in a manner that is analogous to the output 206 of FIG. 2. The operation of the positive differential portion of FIG. 4 is identical to that previously discussed with respect to FIGS. 2–3.

Capacitors 406 and 408 are coupled between the current sources 220p and 220n and the clock signal CLK, respectively. Capacitors 410 and 412 are coupled between the current sources 232p and 232n and the inversion of the clock signal CLK. These capacitors act to reduce the skew between (1) the switching of transistors 222p, 222n, 234p and 234n and (2) the application of the clock signal to capacitors 224p, 224n, 236p, and 236n, respectively. Also, these capacitors increase the rate at which transistors 222p, 222n, 234p and 234n can switch.

It is important to note that the negative differential portion of circuit 400 identified by reference numerals containing the label "n" is nearly identical to the positive differential portion identified by reference numerals containing the label "p". Therefore, the negative differential portion is not discussed in great detail herein. In summary, circuit 400 of FIG. 4 provides a differential input and differential output sample and hold circuit which is improved over that illustrated in FIG. 1 for the same reasons discussed above with reference to FIGS. 2–3.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

What is claimed is:

1. A sample and hold circuit comprising:
a sample circuit coupled to receive an input voltage and generate a sample voltage level at a first node, the sample circuit further comprising:
a capacitor having a first terminal and a second terminal, the first terminal thereof coupled to receive the sample voltage level and the second terminal thereof coupled to receive a first clock signal;
a hold circuit coupled to receive the sample voltage level and maintain an output voltage based on the sample voltage level, at a second nodes for a predetermined portion of the first clock signal; and
a first constant current source coupled to the first node wherein the first constant current source provides a first current in response to receiving a second clock signal that is inverted relative to the first clock signal coupled to the second terminal of the capacitor.

2. The sample and hold circuit of claim 1 further comprising:
a second constant current source coupled to the second node, wherein the second constant current source provides a second current in response to receiving the second clock signal.

3. The sample and hold circuit of claim 1 further comprising:
a second constant current source coupled to the second node for providing a second current in response to receiving the second clock signal;
wherein the first clock signal is an inversion of an input clock signal and the second clock signal is an inversion of the first clock signal.

4. The sample and hold circuit of claim 1 wherein the second node is coupled to an amplifier and the input voltage is cable modem data received via a communication medium.

5. A sample and hold circuit comprising:
a first sample circuit comprising:
a first transistor comprising a first current electrode, a second current electrode and a control electrode, the control electrode of the first transistor being coupled to receive a first input voltage;
a first capacitor having a first terminal and a second terminal, the first terminal of the first capacitor being coupled to the first current electrode of the first transistor and the second terminal of the first capacitor being coupled to receive a clock signal; and
a first hold circuit comprising:
a second transistor comprising a first current electrode, a second current electrode and a control electrode, the control electrode of the second transistor being coupled to the first current electrode of the first transistor;
a second capacitor having a first terminal and a second terminal, the first terminal coupled to the first current electrode of the second transistor, the first terminal of the second capacitor being coupled to provide a first output voltage;
a first constant current source coupled to the first current electrode of the first transistor; and
a second constant current source coupled to the first current electrode of the second transistor, wherein the first constant current source and the second constant current source operate substantially inverted with respect to each other;
the first constant current source further including
a third transistor comprising a first current electrode, a second current electrode and a control electrode, the first current electrode thereof coupled to the first current electrode of the first transistor, the control electrode receiving a first bias voltage
a fourth transistor comprising a first current electrode, a second current electrode and a control electrode, the first current electrode thereof coupled to the second current electrode of the third transistor, the control electrode coupled to the clock signal; and
a third capacitor comprising a first terminal and a second terminal, the first terminal thereof coupled to the second current electrode of the third transistor and the second terminal thereof coupled to the clock signal.

6. The sample and hold circuit of claim 5 wherein the second constant current source further comprises:
a fifth transistor comprising a first current electrode, a second current electrode and a control electrode, the first current electrode thereof coupled to the first current electrode of the second transistor, the control electrode receiving a bias voltage;
a sixth transistor comprising a first current electrode, a second current electrode and a control electrode, the first current electrode thereof coupled to the second current electrode of the fifth transistor, the control electrode coupled to the clock signal; and
a fourth capacitor comprising a first terminal and a second terminal, the first terminal thereof coupled to the second current electrode of the fifth transistor and the second terminal thereof coupled to the clock signal.

7. A sample and hold circuit comprising:
a first sample circuit comprising;
a first transistor comprising a first current electrode, a second current electrode and a control electrode, the control electrode of the first transistor being coupled to receive a first input voltage;
a first capacitor having a first terminal and a second terminal, the first terminal of the first capacitor being coupled to the first current electrode of the first transistor and the second terminal of the first capacitor being coupled to a node to receive a clock signal; and
a first hold circuit comprising;
a second transistor comprising a first current electrode, a second current electrode and a control electrode, the control electrode of the second transistor being coupled to the first current electrode of the first transistor;
a second capacitor having a first terminal and a second terminal, the first terminal coupled to the first current electrode of the second transistor, the first terminal of the second capacitor being coupled to provide a first output voltage the second terminal of the second capacitor being coupled to a voltage reference terminal;
a second sample circuit further comprising;
a third transistor comprising a first current electrode, a second current electrode and a control electrode, the control electrode thereof receiving a second input voltage, the first input voltage and the second input voltage comprising a pair of differential input voltages;
a third capacitor having a first terminal and a second terminal, the first terminal coupled to the first current electrode of the third transistor and the second terminal coupled to the node for receiving the clock signal; and
a second hold circuit further comprising;

a fourth transistor comprising a first current electrode, a second current electrode and a control electrode, the control electrode thereof coupled to the first current electrode of the third transistor; and a fourth capacitor having a first terminal and a second terminal, the first terminal coupled to the first current electrode of the fourth transistor, the first terminal thereof generating a second output voltage, the second terminal being coupled to the voltage reference terminal.

8. The sample and hold circuit of claim 7 further comprising:

a first constant current source coupled to the first current electrode of the first transistor; and a second constant current source coupled to the first current electrode of the second transistor;

wherein the first constant current source and the second constant current source operate substantially inverted with respect to each other;

a third constant current source coupled to the first current electrode of the third transistor; and a fourth constant current source coupled to the first current electrode of the fourth transistor;

wherein the third constant current source and the fourth constant current source operate substantially inverted with respect to each other.

9. The sample and hold circuit of claim 8 wherein the first constant current source further comprises:

a fifth transistor comprising a first current electrode, a second current electrode and a control electrode, the first current electrode thereof coupled to the first current electrode of the first transistor, the control electrode receiving a bias voltage;

a sixth transistor comprising a first current electrode, a second current electrode and a control electrode, the first current electrode thereof coupled to the second current electrode of the fifth transistor, the control electrode coupled to the node for receiving clock signal; and a fifth capacitor comprising a first terminal and a second terminal, the first terminal thereof coupled to the second current electrode of the fifth transistor and the second terminal thereof coupled to the node for receiving the clock signal; and wherein the third constant current source further comprises:

a seventh transistor comprising a first current electrode, a second current electrode and a control electrode, the first current electrode thereof coupled to the first current electrode of the third transistor, the control electrode receiving the bias voltage;

an eighth transistor comprising a first current electrode, a second current electrode and a control electrode, the first current electrode thereof coupled to the second current electrode of the seventh transistor, the control electrode coupled to the node for receiving the clock signal; and a sixth capacitor comprising a first terminal and a second terminal, the first terminal thereof coupled to the second current electrode of the seventh transistors and the second terminal thereof coupled to the node for receiving the clock signal.

10. The sample and hold circuit of claim 9 wherein the second constant current source further comprises:

a ninth transistor comprising a first current electrode, a second current electrode and a control electrode, the first current electrode thereof coupled to the first current electrode of the second transistor, the control electrode receiving the bias voltage;

a tenth transistor comprising a first current electrode, a second current electrode and a control electrode, the first current electrode thereof coupled to the second current electrode of the ninth transistor, the control electrode coupled to the node for receiving the clock signal; and a seventh capacitor comprising a first terminal and a second terminal, the first terminal thereof coupled to the second current electrode of the ninth transistor and the second terminal thereof coupled to the node for receiving the clock signal; and wherein the fourth constant current source further comprises:

an eleventh transistor comprising a first current electrode, a second current electrode and a control electrode, the first current electrode thereof coupled to the first current electrode of the fourth transistor, the control electrode receiving the bias voltage;

a twelfth transistor comprising a first current electrode, a second current electrode and a control electrode, the first current electrode thereof coupled to the second current electrode of the eleventh transistor, the control electrode coupled to the node for receiving the clock signal; and an eighth capacitor comprising a first terminal and a second terminal, the first terminal thereof coupled to the second current electrode of the eleventh transistor and the second terminal thereof coupled to the node for receiving the clock signal.

11. The sample and hold circuit of claim 8 wherein the second constant current source further comprises:

a fifth transistor comprising a first current electrode, a second current electrode and a control electrode, the first current electrode thereof coupled to the first current electrode of the second transistor, the control electrode receiving a bias voltage;

a sixth transistor comprising a first current electrode, a second current electrode and a control electrode, the first current electrode thereof coupled to the second current electrode of the fifth transistor, the control electrode coupled to the node for receiving the clock signal; and a fifth capacitor comprising a first terminal and a second terminal, the first terminal thereof coupled to the second current electrode of the sixth transistor and the second terminal thereof coupled to the node for receiving the clock signal; and wherein the fourth constant current source further comprises:

a seventh transistor comprising a first current electrode, a second current electrode and a control electrode, the first current electrode thereof coupled to the first current electrode of the fifth transistor, the control electrode receiving the bias voltage;

an eighth transistor comprising a first current electrode, a second current electrode and a control electrode, the first current electrode thereof coupled to the second current electrode of the seventh transistor, the control electrode coupled to the node for receiving the clock signal; and a sixth capacitor comprising a first terminal and a second terminal, the first terminal thereof coupled to the second current electrode of the seventh transistor and the second terminal thereof coupled to the node for receiving the clock signal.

* * * * *